United States Patent [19]
Berkovitz

[11] 3,949,325
[45] Apr. 6, 1976

[54] AUDIO EQUALIZERS FOR LARGE ROOMS

[75] Inventor: Robert A. Berkovitz, Lexington, Mass.

[73] Assignee: Dolby Laboratories, Inc., New York, N.Y.

[22] Filed: Dec. 10, 1974

[21] Appl. No.: 531,320

[30] Foreign Application Priority Data
Dec. 22, 1973 United Kingdom............... 59692/73

[52] U.S. Cl. ............ 333/28 R; 179/1 AT; 179/1 D; 333/28 T
[51] Int. Cl.² .......................................... H03H 7/14
[58] Field of Search ............ 333/18, 28 R, 28 T, 29; 179/1 AT, 1 D, 1 H, 1 P, 1 FS

[56] References Cited
UNITED STATES PATENTS

| | | | |
|---|---|---|---|
| 2,444,063 | 6/1948 | Pfleger............................. | 333/28 R |
| 3,135,932 | 6/1964 | Bangert........................... | 333/28 R X |
| 3,551,854 | 12/1970 | Endo et al......................... | 333/28 R |
| 3,803,359 | 4/1974 | Corderman ..................... | 333/28 T X |

*Primary Examiner*—Paul L. Gensler
*Attorney, Agent, or Firm*—Robert F. O'Connell

[57] ABSTRACT

In known audio equalization systems, full room equalization cannot be employed because it introduces undesirable transient effects during the growth stage of a sound field, especially in a large auditorium. The invention seeks to solve this problem by establishing an initial state of the equalizing system giving a reduced degree of equalization whenever a signal commences but which effects a transition to normal equalization within a time typically of the order of some tens of milliseconds.

8 Claims, 6 Drawing Figures

AUDIO EQUALIZERS FOR LARGE ROOMS

The present invention is concerned with an audio equalization system operative upon what will be called a source signal which may emanate from a recording for example. The equalized signal is used to drive one or more loudspeakers which radiate into a room. The invention is particularly applicable to problems which arise in large rooms, cinema auditoria for example. Equalization may be required to deal with predistortion of the source signal, non-linearity of the loudspeaker(s) and the characteristics of the room, and it is with this latter factor that the invention is concerned. For simplicity the other factors will be ignored in the following general explanation of the invention although it will be understood that additional equalization may be employed as and when necessary to deal therewith. In practice loudspeakers of the quality used in large auditoria do have a substantially linear response versus frequency, as tested in an anechoic chamber.

The background to the invention and the invention itself will be explained, by way of example, with reference to the accompanying drawings, in which.

It will be recalled that the equalized signal refers to the signal used to drive the loudspeaker and that the latter is assumed to have a uniform response. It is well known that, if the equalized signal has a level response, the response measured in an auditorium has a characteristic something like the solid curve 10 in FIG. 1. The auditorium usually both attenuates high frequencies and boosts low frequencies. It is also known that the desired characteristic, i.e. the level line 12, could be attained by giving the equalized signal a complementary characteristic as shown by the solid curve 14 in FIG. 2. In practice, this is not possible for the following reasons.

Figure 1:
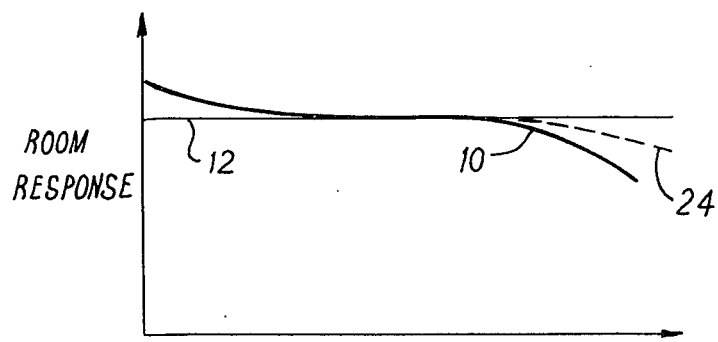
FIGS. 1 to 3 show response curves.

Curve 10 in FIG. 1 relates only to steady state conditions which take an appreciable time to become established in large auditoria. The two solid curves 16 and 18 in FIG. 3 show the sound field in an auditorium created by a burst of tone at a mid frequency and a high frequency respectively, without the equalization of curve 14 in FIG. 2. Each curve shows three stages, namely a growth stage, a steady state stage, and a decay stage. The steady state level of curve 18 (high frequency) is lower than that of curve 16 in conformity with curve 10 of FIG. 1. It will be noted, however, that the growth stage of curve 18 is appreciably shorter than that of curve 16. Depending on the size of the room, the growth stage may be some tens or hundreds of milliseconds. Also, the curves start at the same level, this being a consequence of the uniform speaker response, before interaction with the auditorium has commenced.

Figure 2:
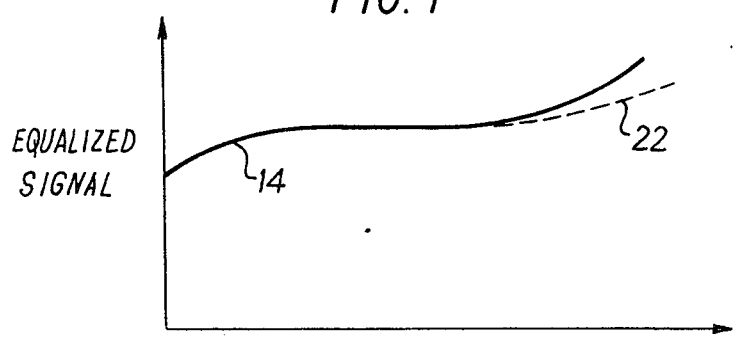
Figure 3:
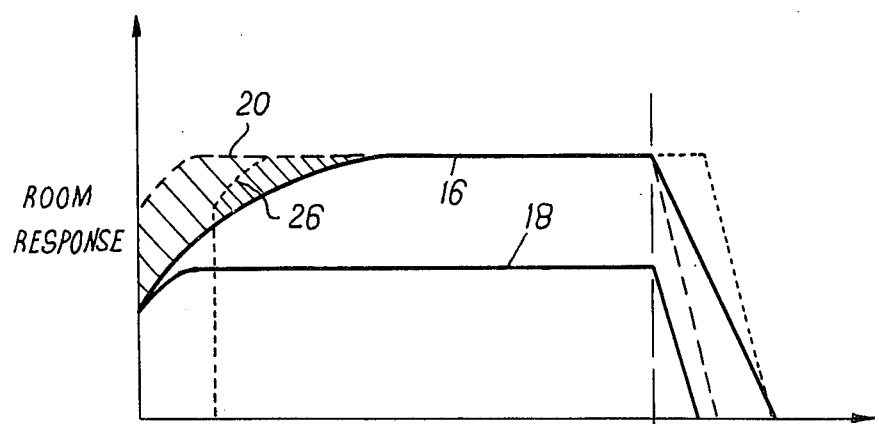

The effect of applying the equalization of FIG. 2 is to lift curve 16 so that its steady state level is the same as that of curve 18, as shown by the broken curve 20. Although steady state levels are now equalized, it can be seen that an excess of high frequency energy has been created in the growth stage, as symbolized by the shaded area of FIG. 3. The effect of this is to cause sounds with quick attacks to start with a hard and unacceptable transient sound. Sound engineers are, therefore, forced to accept a compromise. The amount of high frequency lift in the equalized characteristic of FIG. 2 has to be reduced, as indicated by broken curve 22, so that the room response of FIG. 1 is not level but typically rolls off at 3dB/octave above 2kHz, as indicated by broken curve 24. Good steady-state high frequency response thus has to be sacrificed in order to keep the transient effects in the growth stage to an acceptable level.

The object of the present invention is to improve on this compromise and, according to the invention, this is achieved by providing an audio equalization system operative on a source signal to produce an equalized signal, comprising equalizing means having a normal state in which they establish a predetermined equalization characteristic, and further means operative at an attack in the source signal to delay operation of the equalizing means in the normal state so that an initial state obtains in which there is a reduced degree of equalization and from which a transition to the normal state takes place.

In a preferred system the equalizing means are automatically adjustable and the further means are control means responsive to an attack in the source signal to adjust the equalizing means smoothly from the initial state to the normal state.

The reduced degree of equalization in the initial state may be no equalization at all, or only such equalization as is needed to deal with factors other than room response. The control means may be arranged to respond not only to initial attacks of the source signal but also to abrupt increases in level during the course thereof, and in the latter event momentarily to restore the equalizing means to or towards the initial state, with smooth reversion to the normal state. The equalization means may be arranged to assume the normal state in the absence of a source signal, the control means being responsive to each attack or abrupt increase in level of the source signal to drive the equalizing means momentarily to or towards the initial state.

The transition from the initial state to the normal state is effected by adjustment of the gain versus frequency characteristics of the equalizing means. If these means are simple, providing the action, say, of a treble and/or bass tone control, the whole equalization characteristic can be swung from that obtaining in the initial state to that obtaining in the normal state. This may lead to intermodulation effects and it is preferred to treat the characteristic selectively in each of a plurality of frequency bands, typically one-third octave bands. An attack or abrupt increase in level in any band, then shifts the gain in just that band to the gain pertaining to the initial state and then restores the gain smoothly (e.g. in some tens of milliseconds) to that pertaining to the normal state.

For the sake of completeness a further possibility is mentioned, this being applicable to a multi-channel equalizing means. Instead of effecting gain adjustment in each channel, as just described, each channel can include a delay path whose delay is the greater the greater the relative gain in the channel and whose effect is to delay the characteristic 20 of FIG. 3 to the dotted line characteristic 26. It will be seen that this provision greatly reduces the shaded area, effectively by delaying the attack of the high frequencies relative to the mid frequencies, assuming a characteristic such as curve 14 of FIG. 2 to apply. It can be seen, that a new problem has been created by the effective introduction of phase shifts into the various channels, which can result in frequency response irregularities when the channel outputs are cobined. A possible solution to this is to reduce each delay wholly or partly to zero following each attack in the corresponding channel, but it may be impossible to reduce the delay gradually enough to avoid unacceptable consequences of the frequency changes created by changing delays.

Embodiments of the invention will now be described with reference to FIGS. 4 to 6 of the drawings.

Figure 4:
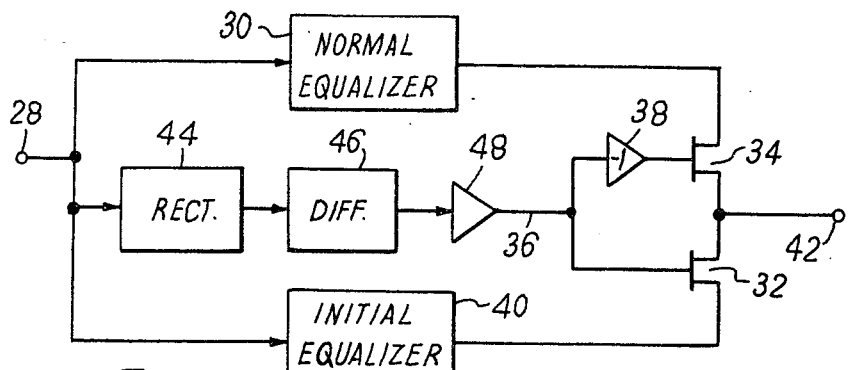
FIGS. 4 to 6 are block diagrams of embodiments of the invention.

Referring to FIG. 4, the source signal is applied to an input terminal 28 connected to an equalizer 30 which provides a normal equalization characteristic, such as a shaped bass cut and treble lift characteristic. The output of the equalizer is connected to one end of a voltage controlled potentiometer, represented, by way of example, as two FET's 32 and 34 controlled by a control signal on line 36, respectively directly and via an inverter 38.

The input terminal is also connected to the other end of the potentiometer through a second equalizer 40 which only introduces such equalization as is called for in the initial state by the loudspeakers and which may be replaced by a direct connection if no such equalization is required. In the absence of a control signal on line 36, FET 34 conducts and the signal from the equalizer 30 passes to an output terminal 42 which is connected to a power amplifier and loudspeakers.

The input terminal 28 is further connected to a rectifier 44 and differentiator 46, the latter of which produces a voltage spike whenever the source signal exhibits an abrupt increase in level. The differentiator has a time constant approximately matched to the growth time of the sound field in the auditorium in which the loudspeakers radiate. The voltage spike is shaped to a reference level by an amplifier 48, whose output is the control signal. The control signal turns on FET 32 and turns off FET 34 and, as it decays, gradually turns these FET's back off and on again, respectively.

The effect of this is, assuming a level response when equalizer 40 is acting, to go to an initial state of a level response whenever there is an abrupt increase in level of the source signal, with smooth transition from the level response to the normal state, which may be curve 14 of FIG. 2. The full treble lift of curve 14 can be employed because this curve is not operative in the initial state and the excess high frequency boost in the growth stage, explained above, is eliminated.

The system of FIG. 4 can be modified to increase the degree of equalization when the source signal exhibits an abrupt decrease in level. This will have no effect when the source signal ceases, since radiation then ceases, but may have an advantageous effect when there is an abrupt decrease to a non-zero level.

Figure 5:
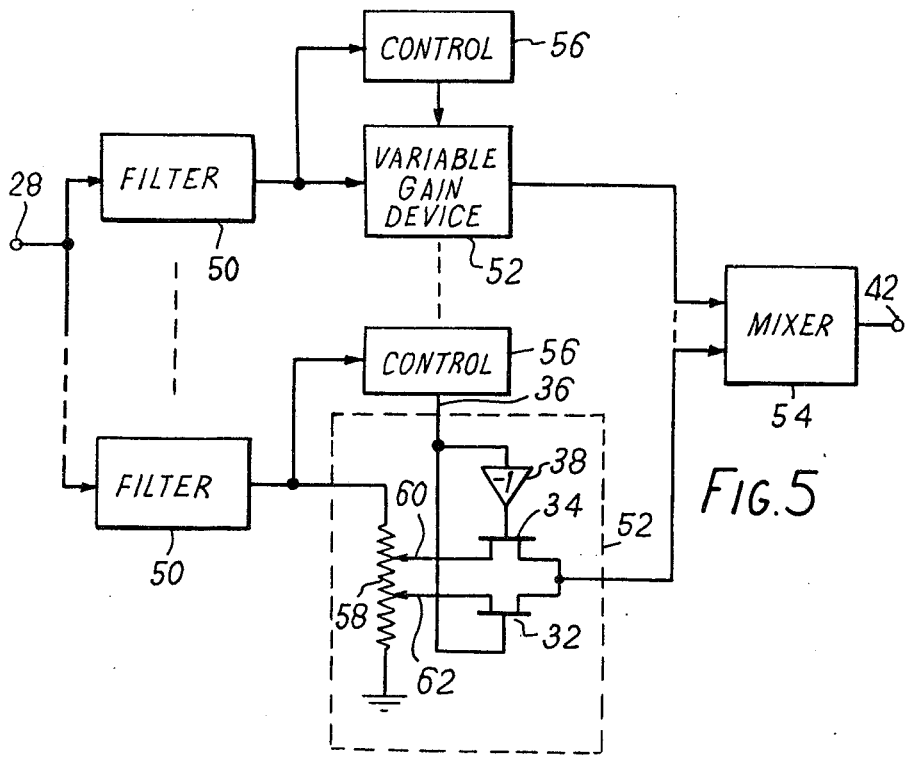

FIG. 5 shows a system similar to that of FIG. 4 but modified to treat each channel of a multichannel equalizer independently. All channels are structurally the same and two only are shown. There may be 27 channels at one-third octave intervals, covering nine octaves in all. Each channel comprises a band pass filter 50 feeding a variable gain device 52. The outputs of the variable gain devices are combined by a mixer 54 which feeds the equalized signal to output terminal 42. Each variable gain device 52 is controlled by an individual control circuit 56 which may be constructed as in FIG. 4 of circuits 44, 46 and 48, and which responds to abrupt increases in source signal level at the output of the corresponding filter 50.

A possible construction of one of the variable gain devices 52 is shown. The signal from the filter 50 is applied across a variable gain potentiometer 58 whose mid-point corresponds to a level response. A first tap 60 may be adjusted above or below the mid-point to establish the boost or cut required in the channel in accordance with characteristics 14, say, of FIG. 2. In the normal state the output from this tap is applied through FET 34 to the mixer 54.

A second tap 62 may correspondingly be adjusted in accordance with the boost or cut required in the channel in the initial state. If the initial state is always to be a level response, all the taps 62 may be fixed taps at the mid-points of the potentiometer 58. When a control signal appears in the channel, FET 32 conducts to connect tap 62, instead of tap 60, to the mixer and, as the control signal decays, the transition from this initial state to the normal state occurs, as described for FIG. 4.

The equalizing means do not have to be of the nature described. They may be as described, for example, in the specification of copending application Ser. No. 524,827, filed Nov. 18, 1974. This specification describes a multichannel equalizer including a presettable potentiometer in each channel. Each such potentiometer can be replaced by a voltage controlled potentiometer controlled by its individual control circuit 56 and constructed as in FIG. 5, for example.

Figure 6:
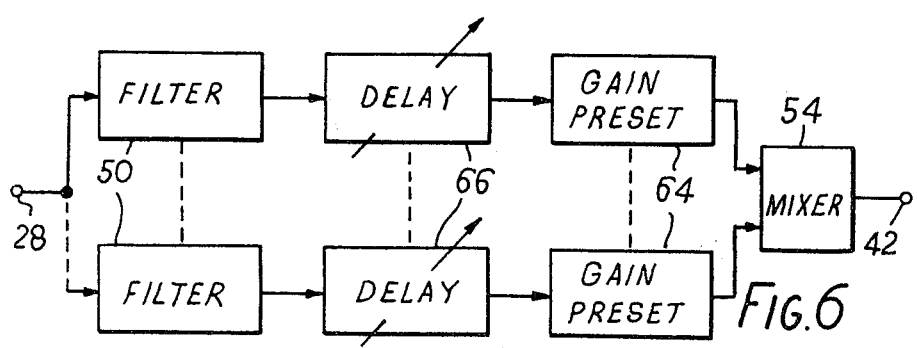

FIG. 6 illustrates an embodiment which utilizes delays in a direct manner, instead of gain adjustments to delay operation in the normal state. A multichannel equalizer has a filter 50 in each channel and a presettable gain device 64. Each device 64 is preceded by an adjustable delay device 66. The delay device for the channel having the lowest gain on curve 14 (FIG. 2) is set to zero delay. The delay devices in the other channels are adjusted so that the delay is the greater the greater the gain of the channel relative to the channel with the lowest gain. The longest delay does not, however, exceed the duration of the growth stage of the sound field.

I claim:

1. An audio equalization system operative on a source signal to produce an equalized signal, comprising equalizing means having a normal state in which said means establishes a predetermined equalization characteristic, and further means operative at an attack in the source signal to delay operation of the equalizing means in the normal state so that an initial state obtains in which there is a reduced degree of equalization and from which a transition to the normal state takes place.

2. A system according to claim 1, wherein the further means is control means responsive to an attack in the source signal to adjust the equalizing means smoothly from the initial state to the normal state.

3. A system according to claim 2, wherein the reduced degree of equalization in the initial state is no equalization at all.

4. A system according to claim 2, wherein the control means is constructed to respond also to abrupt increases in level of the source signal during the course thereof momentarily to restore the equalizing means at least partially to the initial state with smooth reversion to the normal state.

5. A system according to claim 2, wherein the equalization means is arranged to assume the normal state in the absence of a source signal, the control means being responsive to each attack or abrupt increase in level of the source signal to drive the equalizing means momentarily at least partially to the initial state.

6. A system according to claim 2, wherein the equalization means is a multichannel equalization means with a plurality of channels assigned to different frequency bands, each channel having an individual control means responsive to an abrupt increase in level in the corresponding band momentarily to shift the gain of the channel to the gain pertaining to the initial state and then to restore the gain smoothly to that pertaining to the initial state.

7. An audio equalization system comprising an input terminal for a source signal to be equalized, a plurality of channels connected to the input terminal and including filters assigning the channels to different frequency bands, means establishing different relative gains in the channels, and delay means in the channels providing the channels with delays which are the greater the greater the relative channel gain.

8. An audio equalization system according to claim 7, comprising a mixer for mixing signals provided by the channels, thereby to provide an equalized output signal.

* * * * *